United States Patent
Onabe et al.

(10) Patent No.: US 6,174,750 B1
(45) Date of Patent: Jan. 16, 2001

(54) PROCESS FOR FABRICATING A DRIFT-TYPE SILICON RADIATION DETECTOR

(75) Inventors: Hideaki Onabe, Utsunomiya; Toshisuke Kashiwagi, Tokyo; Koichi Kawasaki, Chigasaki, all of (JP)

(73) Assignee: Raytech Corporation (JP)

( * ) Notice: Under 35 U.S.C. 154(b), the term of this patent shall be extended for 0 days.

(21) Appl. No.: 09/399,864

(22) Filed: Sep. 21, 1999

(30) Foreign Application Priority Data

Mar. 11, 1999 (JP) .................................................. 11-064668

(51) Int. Cl.$^7$ .................................................. H01L 21/00
(52) U.S. Cl. .............................. 438/56; 438/48; 438/141; 438/380; 438/473; 438/476; 438/514; 438/542
(58) Field of Search .............................. 438/56, 473, 476, 438/48, 141, 380, 514, 542

(56) References Cited

U.S. PATENT DOCUMENTS 5,156,979 * 10/1992 Sato et al. .............................. 438/56
5,457,322 * 10/1995 Kitaguchi et al. .............. 250/370.06

* cited by examiner

Primary Examiner—Charles Bowers
Assistant Examiner—Hsien-Ming Lee
(74) Attorney, Agent, or Firm—Skjerven, Morrill, MacPherson LLP; Signe M. Holmbeck; Norman R. Klivans

(57) ABSTRACT

In a process for fabricating a radiation detector comprising the step of drifting lithium from one side of a silicon wafer, a boron diffusion layer is formed on the other side of the silicon wafer prior to the drifting step. Therefore, in spite of the tendency of the drift layer to have uneven thickness, the drift layer is allowed to be formed uniformly over the entire area. This eliminates the need to lap the other side of the wafer to expose the drift layer over the entire surface. Also, a PN junction diode is formed on the other side of the wafer, and this makes the completed detector resistant to environmental influences, as opposed to conventional radiation detectors of this type which include a surface barrier type diode.

7 Claims, 9 Drawing Sheets

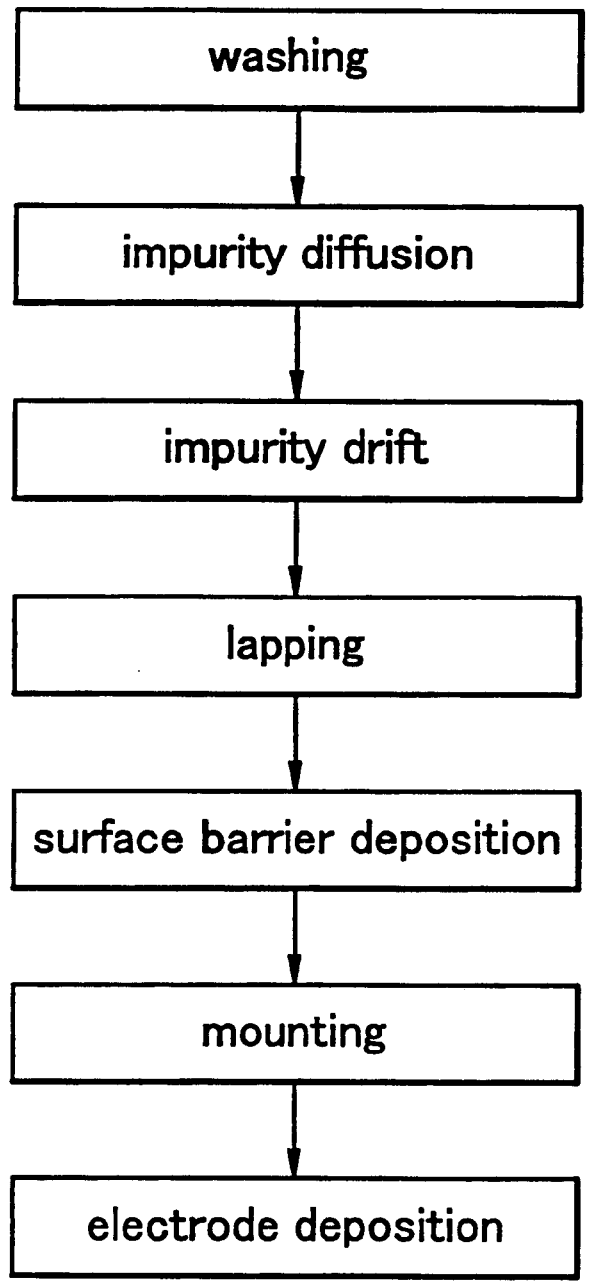

PRIOR ART

PROCESS FOR FABRICATING A DRIFT-TYPE SILICON RADIATION DETECTOR

TECHNICAL FIELD

The present invention relates to a silicon radiation detector, and in particular to a process of fabricating a drift-type silicon radiation detector having a PN junction included therein.

BACKGROUND OF THE INVENTION

FIG. 1 shows the various steps of a conventional process of manufacturing a silicon radiation detector which includes the steps of:
(1) washing the silicon wafer (FIG. 2a)
(2) impurity doping (FIG. 2b)
(3) impurity drifting (FIG. 2c)
(4) lapping (the surface opposite to the doped layer) (FIG. 2d)
(5) metal deposition (to form a surface barrier) (FIG. 2e)
(6) bonding (mounting)
(7) depositing electrodes First of all, a silicon wafer 1 is washed (FIG. 2a), and a diffusion layer 3, for instance consisting of a lithium doped layer is formed on one side thereof as illustrated in FIG. 2b. The impurity in the diffusion layer 3 is then drifted toward the other side of the wafer 1. However, the drift speed in the peripheral part of the wafer 1 is substantially faster than the central part thereof so that a drift layer 4 having an uneven thickness is produced as illustrated in FIG. 2c.

The unevenness in the drift speed may be attributed to an unevenness in the distribution in the impurities in the wafer. When fabricating a wafer, a cylindrical silicon crystal is grown in a furnace, and this process involves a solidification of silicon from a liquid phase to a solid phase. The central part of the silicon crystal tends to solidify later than the peripheral part thereof. Therefore, impurities such as phosphorus and crystal defects tend to be concentrated in the central part. As a result, when the silicon crystal is sliced into wafers, the central part of each wafer contains impurities and defects more in the central part than the peripheral part. Because such impurities and defects impede the drift process, the drift speed in the peripheral part of the wafer is greater than that in the central part.

Therefore, the other side which has failed to be formed into a uniform drift layer is ground or lapped so as to expose the drift layer 4 over the entire surface as illustrated in FIG. 2d. Then, a surface barrier layer 5 is formed on the lapped surface as illustrated in FIG. 2e.

In the step (3) of impurity drifting, because the drift speed in the peripheral part of the wafer is higher than that in the central part, when the impurity has reached the other side of the wafer in the peripheral part, the impurity may not have still reached the other side in the central part. Therefore, conventionally, it was necessary to carry out the step (4) of lapping the opposite surface of the wafer so that the drifted impurity may show over the entire opposite surface of the wafer.

Thus, the conventional process has the following disadvantages.
(a) The step of lapping off a substantial thickness of the substrate was required upon completion of drift.
(b) The step of depositing a metallic layer to form a surface barrier layer was required upon completion of drift. This metal deposition step requires the metal to be processed at a high temperature (of 500° C. or higher). However, because the drift layer was formed by drifting a doped layer at a temperature in the order of 150° C., the drift layer may be destroyed during such a high temperature deposition step.
(c) Because a surface barrier type diode is formed in a drift-type silicon radiation detector fabricated by such a conventional process, the device is vulnerable to an adverse environment (pressure changes, humidity and foreign particles), and may suffer degradation over time.
(d) The drift speed tends to be uneven because of the uneven distribution of the impurity in the silicon substrate, and this causes some difficulty in fabricating a large-diameter (three inches or larger), large-thickness (5 mm or larger) radiation detector.

BRIEF SUMMARY OF THE INVENTION

In view of such problems of the prior art, a primary object of the present invention is to provide a silicon radiation detector which is resistant to adverse environments.

A second object of the present invention is to provide a silicon radiation detector including a PN junction diode therein, instead of a surface barrier type diode.

A third object of the present invention is to provide a silicon radiation detector having a detection layer having a large thickness.

A fourth object of the present invention is to provide a silicon radiation detector which demonstrates a high signal to noise ratio.

According to the present invention, these and other objects can be accomplished by providing a process for fabricating a drift-type radiation detector including a PN junction, comprising the steps of: washing a semiconductor wafer of a first conductivity type; forming oxide layers on a first major surface of the semiconductor wafer and a second major surface opposite to the first major surface; removing oxide layers from target areas of the first and second major surfaces by a photo engraving process; forming a first diffusion layer in the target area of the first major surface by diffusing a first impurity having the first conductivity type; forming a second diffusion layer in the target area of the second major surface by diffusing a second impurity having a second conductivity type different from the first conductivity type; and drifting the second diffusion layer toward the first major surface so as to form a drift region extending from the second diffusion layer to the first diffusion layer, and to form a PN junction between the drift region and the first diffusion layer.

Because the first diffusion layer stops any further drifting of the second impurity, the drift layer can be uniformly formed over the entire area of the wafer without any spatial unevenness in the drift speed. Therefore, the lapping process to expose the drift layer is not required. Also, because a PN junction diode is formed at the interface between the drift layer and the first diffusion layer, the device is made highly resistant to environmental impacts. Owing to the elimination of the need to form a surface barrier metallic layer, as opposed to the conventional process, a high performance of the device can be ensured, and the fabrication process can be simplified at the same time.

For instance, when the second diffusion layer consists of a lithium doped layer formed in a silicon wafer which is lightly doped with boron, the drift process progresses as the electrons of the lithium complement the positive holes of boron. Because a boron doped layer (the first diffusion layer) having a substantially higher concentration of boron than the substrate is formed on the other side of the wafer, the drift layer apparently stops at the interface with the boron-doped layer because the complementing process takes a substantially longer period of time at the interface than in the substrate.

Typically, the semiconductor wafer of the first conductivity type consists of a silicon wafer lightly doped with boron, and the step of oxidizing the first and second major surfaces of the semiconductor wafer comprises the step of heating the semiconductor wafer in the presence of oxygen. The first impurity preferably consists of a member selected from a group consisting of boron (B), aluminum (Al), indium (In), zinc (Zn), gallium (Ga) and thallium (Ti), and the second impurity preferably consists of a member selected from a group consisting of lithium (Li), phosphorus (P), arsenic (As), antimony (Sb) and bismuth (Bi). More preferably, the first impurity consists of boron (B), and the second impurity consists of lithium (Li).

The required duration of the drift step can be computed by the following equation:

$$W = (2 \times \mu V t)^{1/2} \qquad \text{(Eq. 1)}$$

where W is the width (cm) of the drift region, $\mu$ is the mobility of the second impurity (cm$^2$/V.sec), V is the reverse bias voltage (V), and t is the drift time (sec). Thus, it is possible to fabricate the device in a highly predictable manner, and ensure a required performance without fail.

BRIEF DESCRIPTION OF THE DRAWINGS

Now the present invention is described in the following with reference to the appended drawings, in which:

FIG. 1 is a flow chart showing the conventional process of fabricating a silicon radiation detector;

DETAILED DESCRIPTION OF THE PREFERRED EMBODIMENTS

Figure 2A:
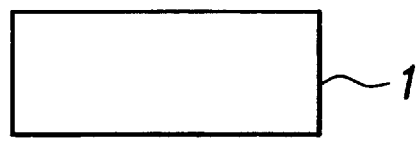
FIGS. 2a to 2e show sectional views of a silicon radiation detector in various steps of the conventional process of fabrication.
Figure 2B:
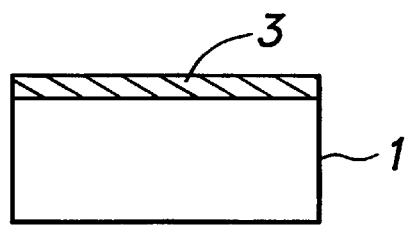
Figure 2C:
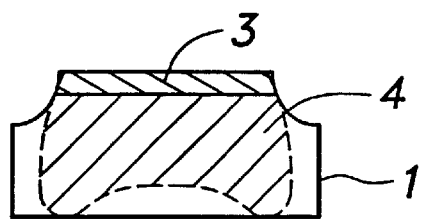
Figure 2D:
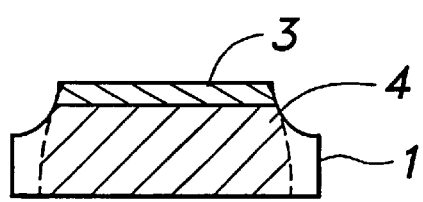
Figure 2E:
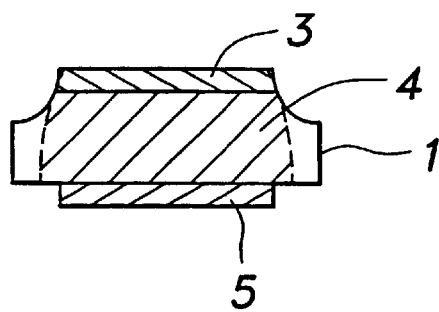
Figure 3:
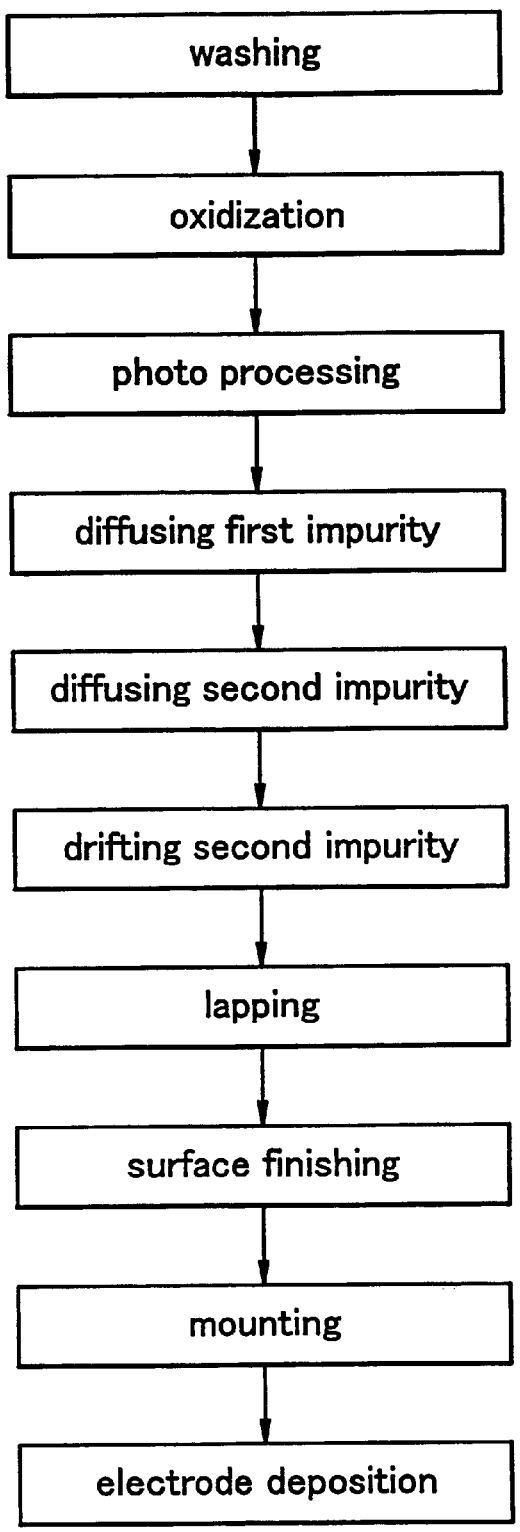
FIG. 3 is a flow chart showing a process of fabricating a silicon radiation detector according to the present invention.

As shown in FIG. 3, the process of fabricating a silicon radiation detector embodying the present invention may comprise the steps of:
(1) washing (FIG. 4a)
(2) oxidization
(3) photo engraving processing
(4) diffusing a first impurity (FIG. 4b)
(5) diffusing a second impurity (FIG. 4c)
(6) drifting the second impurity (FIG. 4d)
(7) lapping
(8) surface finishing (optional)
(9) bonding (mounting)
(10) depositing electrodes The fabrication process is described in the following in terms of a concrete embodiment. The specifications of the silicon wafer serving as the base material for this process are listed in the following.

| crystal forming process | FZ process |
| --- | --- |
| crystal orientation | <111> or <100> |
| doping agent | B (boron) |
| resistivity | 100–3,000 Ω · cm |
| carrier life time | 1 ms or longer |
| dislocation density | 1,000/cm$^2$ or less |
| P (phosphorus) concentration | 5 × 10$^{12}$ or less |
| O (oxygen) concentration | 1 × 10$^{16}$ or less |
| surface finishing | lapping or one-side mirror finish |

In this example, the first impurity consisted of boron (B), and the second impurity consisted of lithium (Li). The first impurity may also consist of such P-type impurities (acceptors) as aluminum (Al), indium (In), zinc (Zn), gallium (Ga) and thallium (Tl). The second impurity may also consist of such N-type impurities (donors) as phosphorus (P), arsenic (As), antimony (Sb) and bismuth (Bi).

(1) washing step

Figure 4A:
FIGS. 4a to 4d show sectional views of a silicon radiation detector in various steps of the fabrication process according to the present invention.

First of all, the wafer 1 shown in FIG. 4a is ultrasonically or boil washed in such organic solvents as acetone and methanol. The wafer is then boil washed in aqua regia, and thereafter washed in flowing pure water or deionized water (15 MΩ.cm or higher). Finally, the fragmented or spalled surface layer is etched off by an etchant (such as 1HF:2HNO$_3$:1CH$_3$COOH).

(2) oxidizing step

The wafer 1 is heated for seven hours in pure oxygen at 850° C. (600 to 900° C.) to form a SiO$_2$ layer having a thickness of 5,000 Å.

(3) photo engraving processing (PEP) step

The part of the SiO$_2$ layer which is an object of the subsequent diffusion step is etched off.

(4) B (boron) diffusion step

Figure 4B:
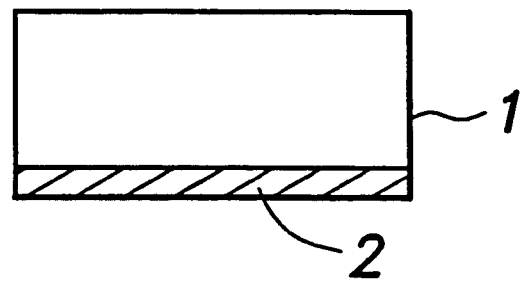

PBF (polyboron film) is applied to a surface area designated for diffusion, and the wafer is kept at 850° C. (600 to 900° C.) for 24 hours so as to form a B diffusion layer 2 having a depth of 0.4 μm (0.2 μm or greater) as shown in FIG. 4b.

(5) Li (lithium) diffusion step

Figure 4C:
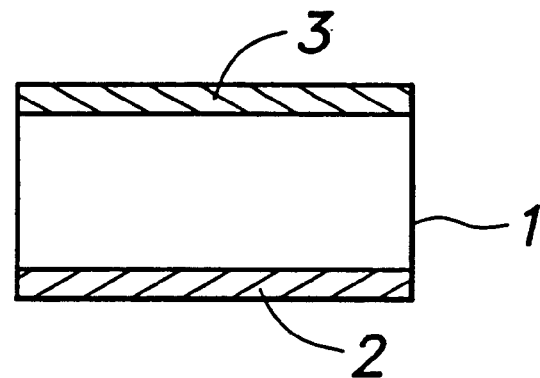

The surface (reverse surface) of the wafer opposite to the surface (front surface) having the B diffusion layer 2 formed thereon is kept at 450° C. (400 to 500° C.) in a vacuum environment (1×10$^{-4}$ Torr or higher vacuum) for 6 minutes (3 to 15 minutes) so as to form a lithium diffusion layer 3 having a depth of 0.3 mm to 0.7 mm as shown in FIG. 4c.

(6) Li (lithium) drift step

To improve the reverse direction properties of the PN junction diode that is going to be formed in the wafer, the reverse surface having the Li diffusion layer 3 formed thereon is mesa etched or grooved, and is subjected to a drift process at the voltage of 1,000 V/cm (500 to 2,000 V/cm) and the temperature of 130±20° C. for a time period t which is determined by the following equation.

$$W = (2 \times \mu V t)^{1/2} \qquad \text{(Eq. 1)}$$

where W is the width (cm) of the drift region, $\mu$ is the mobility of lithium (cm$^2$/V.sec), V is the reverse bias voltage (V), and t is the drift time (sec).

Figure 4D:
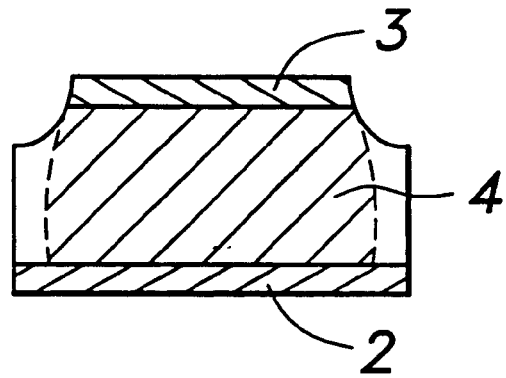

When the drift process has been conducted for the time duration t determined by Eq. 1, the obtained Li drift layer 4 adjoins the B diffusion layer 2 which has been formed earlier over the entire radial cross section, and a PN junction is formed between the Li drift layer 4 and the B diffusion layer 2 as shown in FIG. 4d.

(7) lapping step (optional)

When a transmission-type radiation detector is to be fabricated, following the Li drift step, the Li diffusion layer 3 is completely ground off.

(8) surface finishing step

The wafer is washed in flowing pure water or deionized water (15 MΩ.cm or higher). The wafer is ultrasonically or boil washed in such organic solvents as acetone and methanol. The wafer is then boil washed in aqua regia. The wafer is then washed for the second time in flowing pure water or deionized water (15 MΩ.cm or higher). Finally, the ground surface and side surface (the entire surface except for the surface of the B diffusion layer 2) are etched by an etchant (such as $1HF:3HNO_3$).

(9) bonding (mounting) step

Figure 5A:
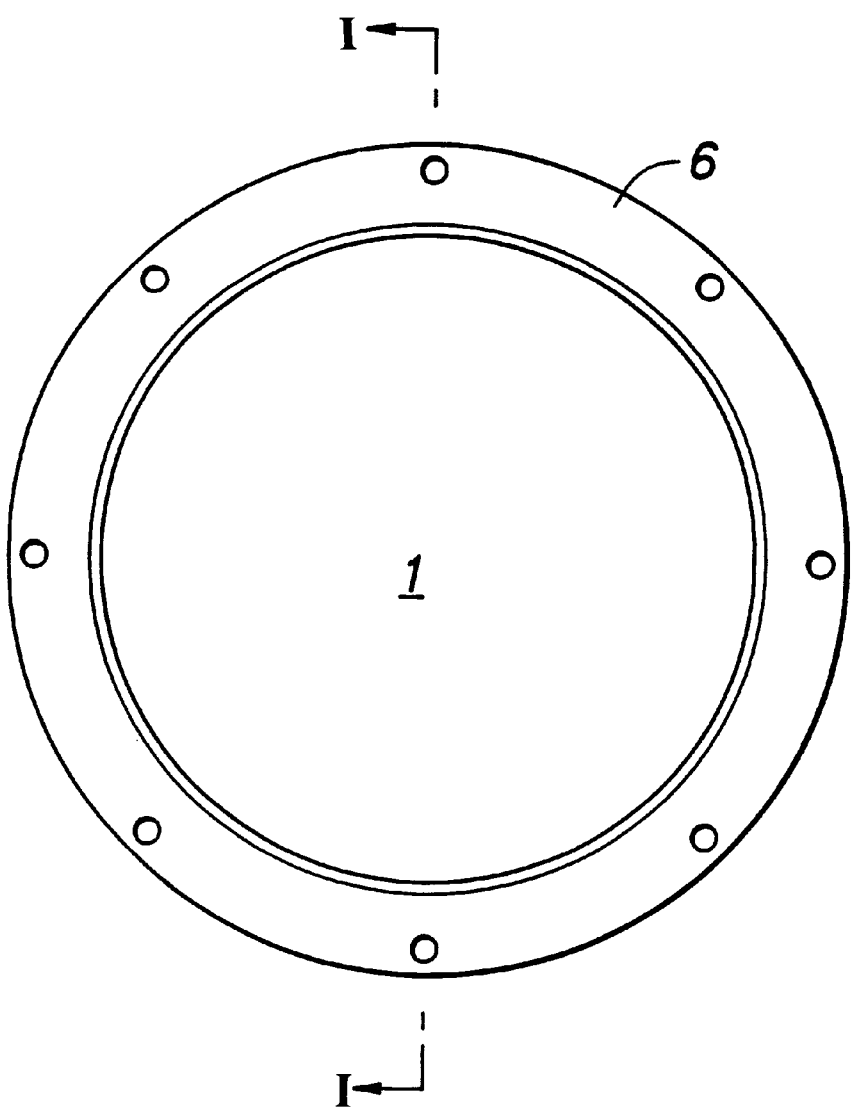
FIGS. 5a and 5b are plan and sectional side (taken along line II of 5a) views of a silicon radiation detector fabricated by the process of the present invention.
Figure 5B:
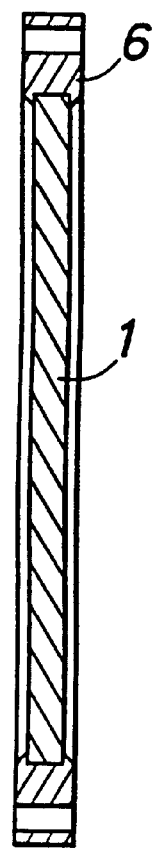

The wafer 1 is bonded to an insulator 6 (FIGS. 5a and 5b) such as glass epoxy, acrylic and ceramic materials by using an insulating bonding agent.

(10) electrode deposition step

Electrodes are formed on the wafer by depositing metallic material such as Au, Pt, Pd, Ni and Al, for instance, by vacuum vapor deposition.

The specifications and evaluation data of a silicon radiation detector fabricated by the above described process are summarized in the following.

Specifications

| dimensions | 146 mm in diameter, and 10 mm in thickness |
| --- | --- |
| effective diameter | 114 mm or larger |
| effective thickness | 6,000 $\mu$m ± 200 $\mu$m |
| thickness uniformity of the sensitive region | ±10 $\mu$m or less (over more than 95% of the entire surface area) |
| total depletion voltage | 600 V |
| breakdown voltage | 800 V |
| leak current | 150 $\mu$A or less (at 600 V, 25° C.) |
| electrodes | side surface |

Evaluation data

Figure 6:
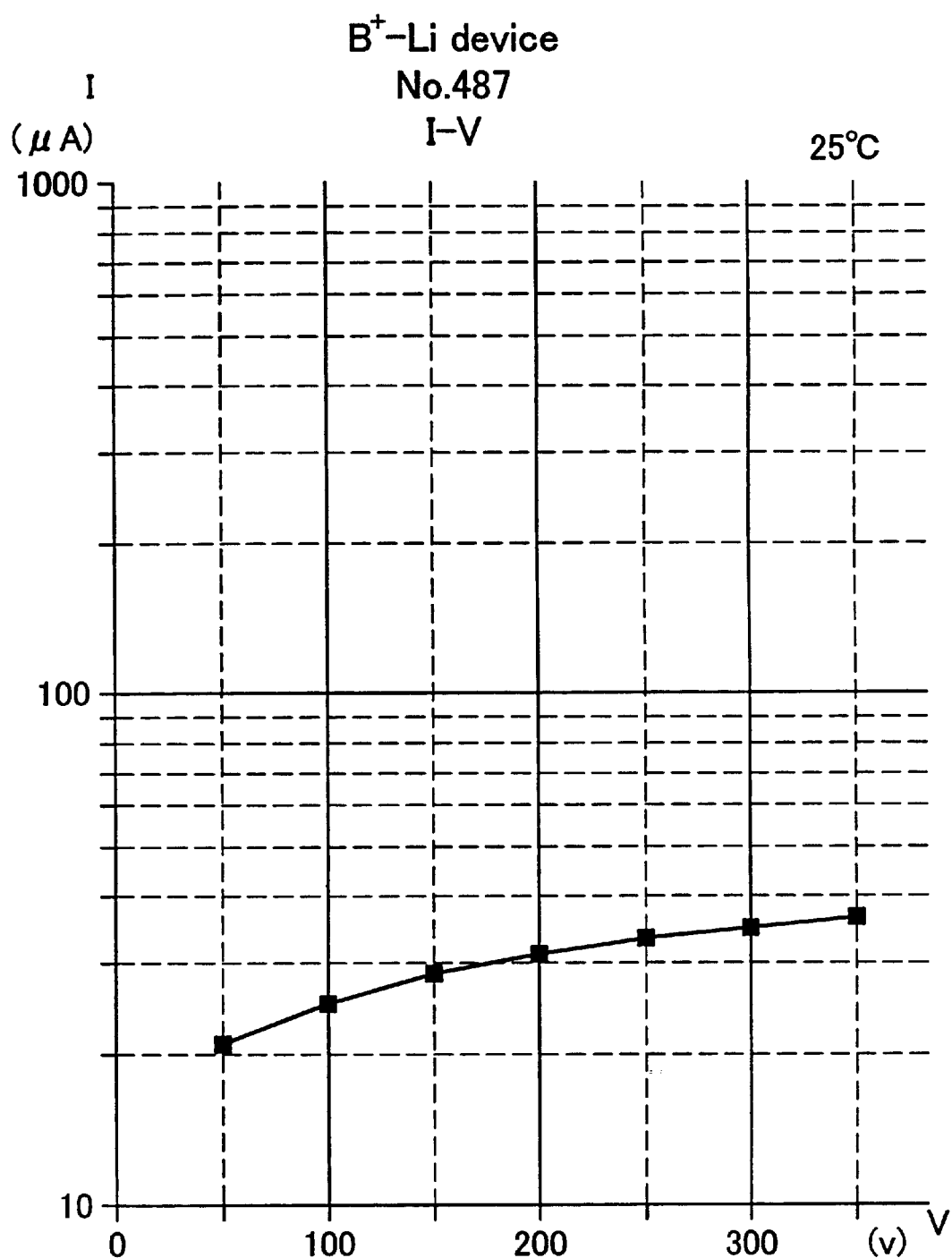
FIG. 6 is a graph showing the voltage-current characteristics of the silicon radiation detector fabricated by the process of the present invention.

The electric voltage-current characteristics of the silicon radiation detector are shown in the graph of FIG. 6. The current level was approximately 21 $\mu$A at the minimum test voltage of 50 V, and approximately 38 $\mu$A at the maximum test voltage of 350 V.

Figure 7:
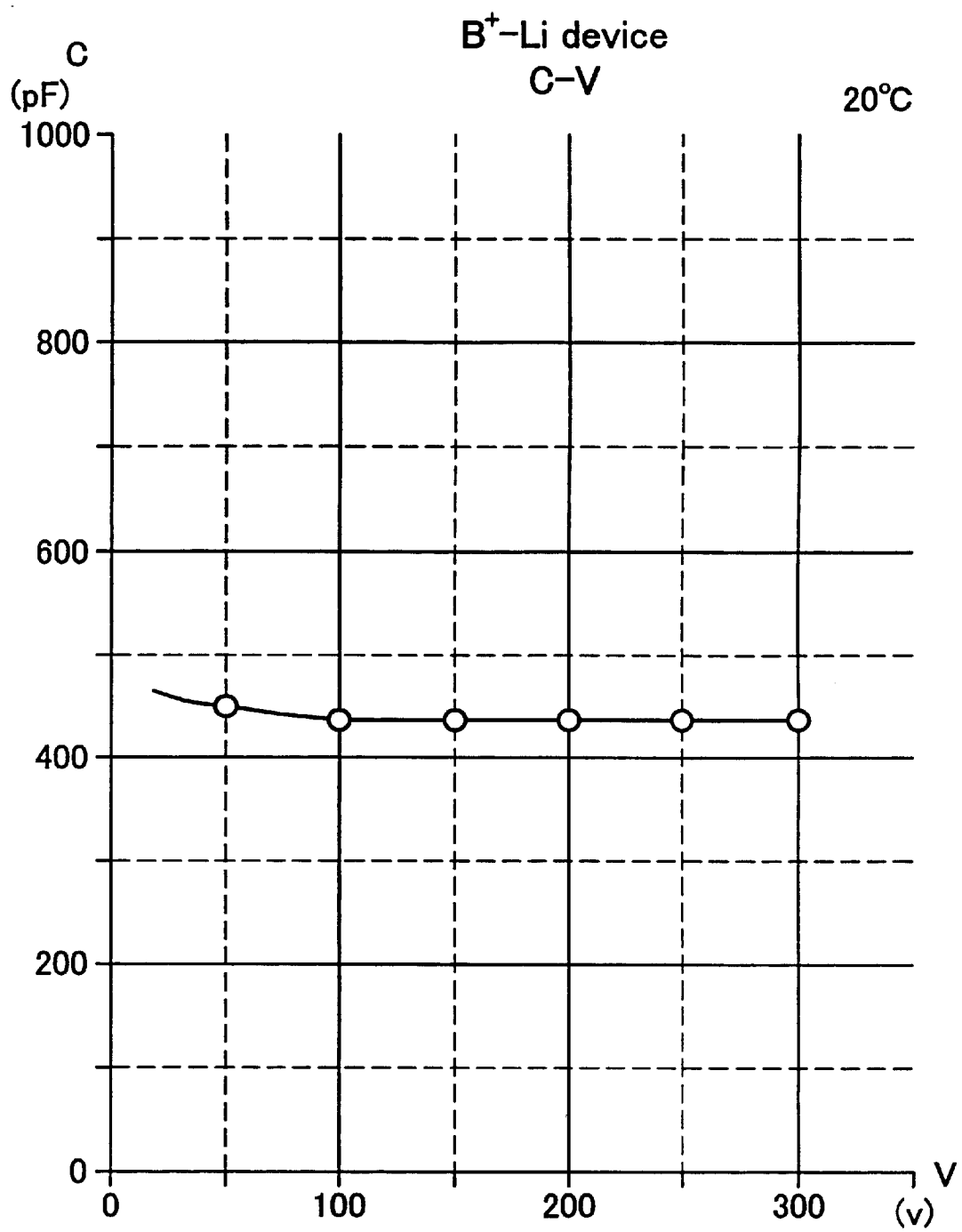
FIG. 7 is a graph showing the voltage-capacitance characteristics of the silicon radiation detector fabricated by the process of the present invention.

The electric voltage-capacitance characteristics of the silicon radiation detector are shown in the graph of FIG. 7. It indicates that the depletion layer would not be excessively expanded by the bias voltage owing to the extremely high resistivity of the drift layer. A high resistivity means a low carrier concentration, and allows the depletion layer to expand at a relative low voltage. The thickness of the depletion layer in turn corresponds to the effective thickness of the detector. Radiation is thus detected over the effective thickness of the detector. In short, a low carrier concentration allows a thick detector to be formed. In the embodiment described above, the boron layer had a thickness in the order of 0.5 $\mu$m, and this thickness is desired to be as small as possible because this layer provides an insensitive window through which radiation is admitted into the sensitive lithium drift layer which has a thickness in the order of several millimeters. If the depletion layer reaches the outer surface of the boron layer, a breakdown will occur. However, the boron layer is given with a high dopant concentration or a high carrier concentration so as to prevent this from occurring.

Figure 8:
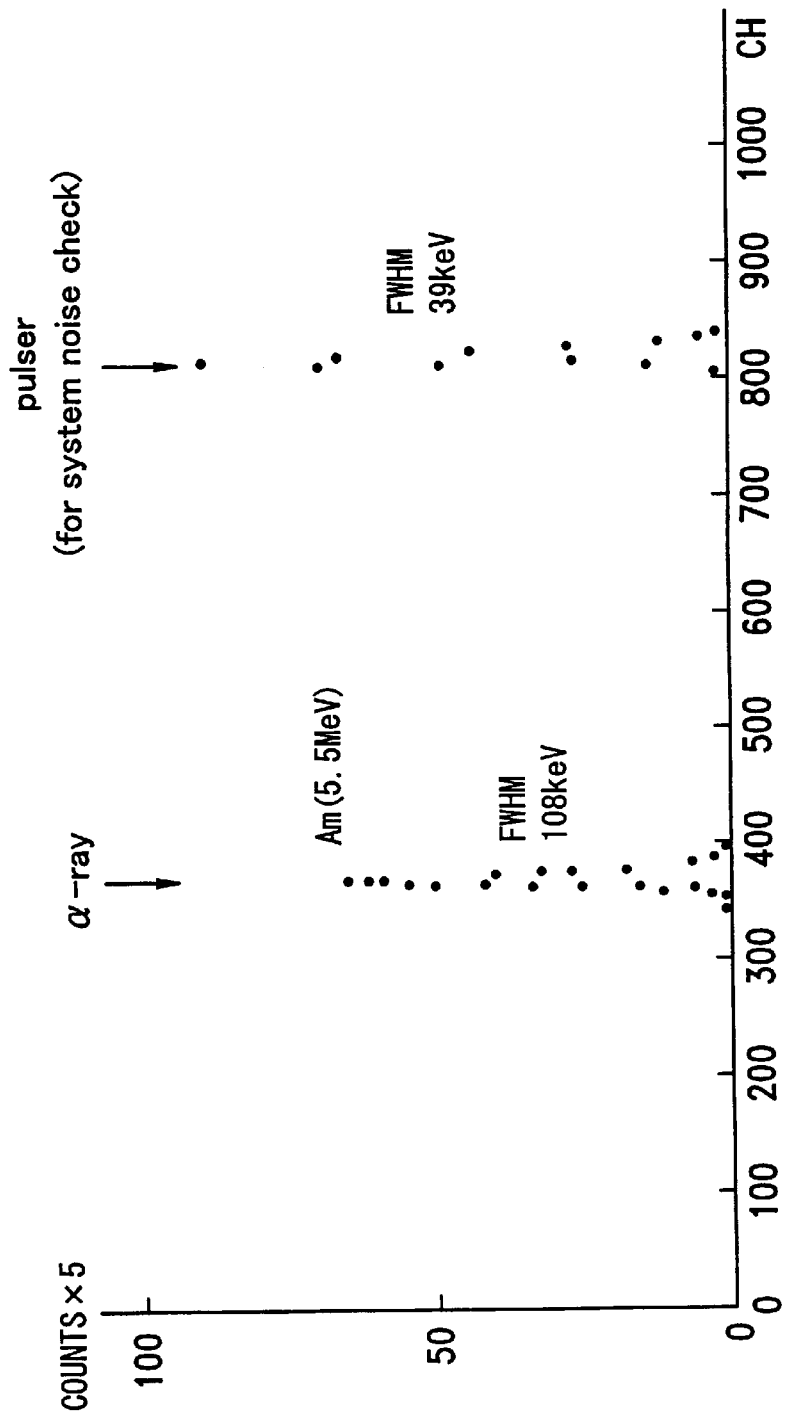
FIG. 8 is a measured spectral graph showing the α-ray resolution power characteristics of the silicon radiation detector fabricated by the process of the present invention.

The spectral property of the silicon radiation detector was actually measured as shown in the graph of FIG. 8 to evaluate the α-ray resolution power of the detector. The abscissa indicates the channels which correspond to different energy levels of the α-ray radiation, and the ordinate indicates the detected count numbers at each channel. The resolution power is given as a ratio of the channel width of half the maximum count to the channel number at the maximum count. The smaller the ratio is, the better the detector is considered.

The graph of FIG. 8 indicates that the maximum count is obtained at 378.7 channels (5.5 MeV) and the channel width at half the maximum count was 7.43 channels (108 keV). Therefore, the resolution power of this detector was $$108 \text{ keV}/5.5 \text{ MeV}=0.0196=1.96\%.$$

One of the factors which prevents a high resolution power is the scattering of α-ray radiation within the detector. A primary reason for the scattering within the detector is found in the presence of a surface insensitive layer which may be formed when the second impurity drift layer fails to reach the first impurity diffusion layer. Because the α-ray radiation of 5.5 MeV can penetrate the silicon only to the depth of approximately 30 $\mu$m, presence of such an insensitive layer causes the resolution power to be impaired.

The radiation detector fabricated by the process of the present invention demonstrated the resolution power of 1.96% which is considered to be acceptable and indicates the absence of an insensitive surface layer.

The pulser in the graph of FIG. 8 indicates the noises of the measurement system, and the associated data were obtained by applying a simulated signal directly to the preamplifier for amplifying the output signal from the detector.

Figure 9:
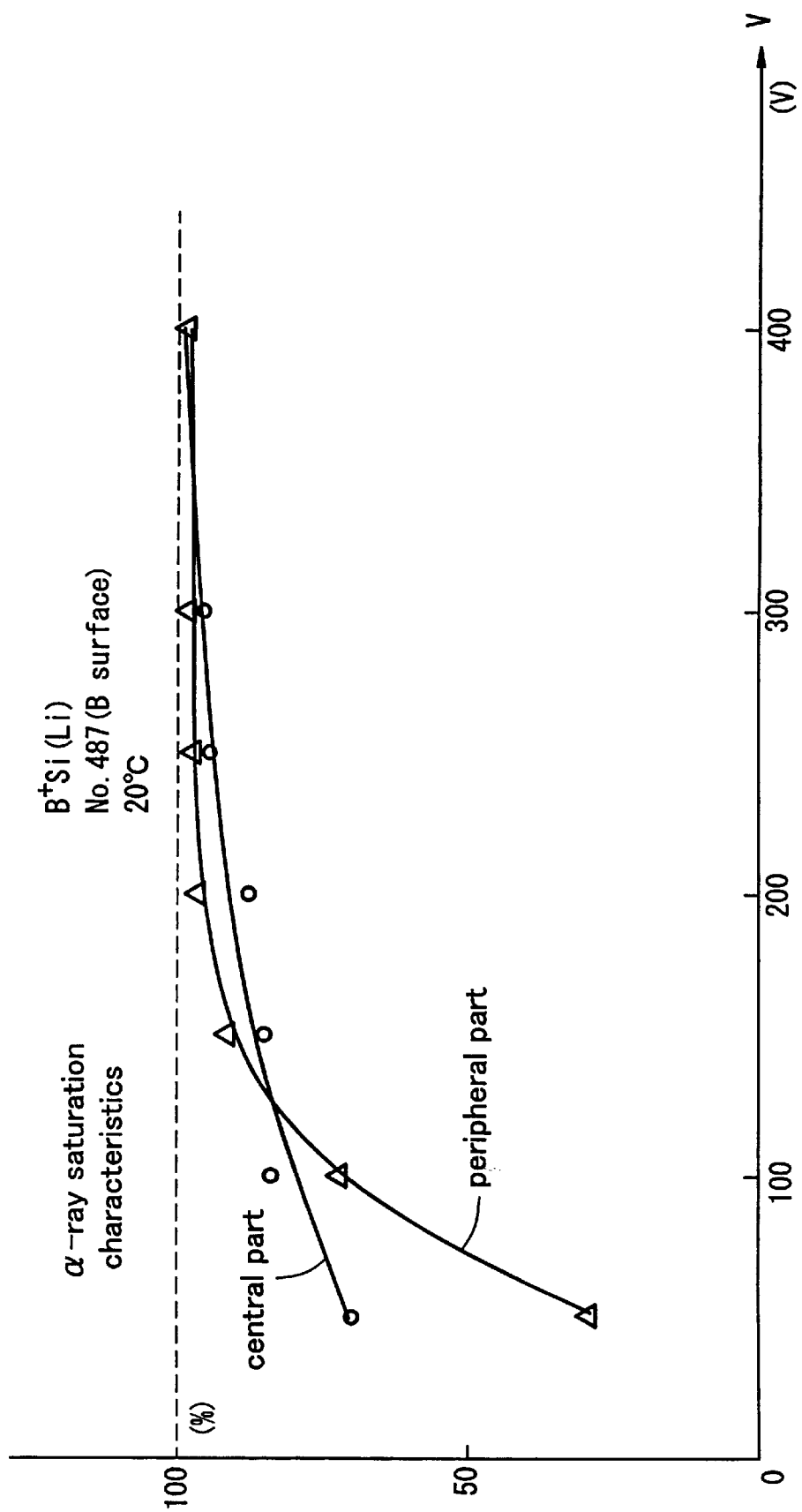
FIG. 9 is a graph showing the α-ray saturation characteristics of the silicon radiation detector fabricated by the process of the present invention.

The α-ray radiation saturation property of the silicon radiation detector according to the present invention is shown in FIG. 9. This test was conducted for the purpose of investigating the extent of the insensitive region (the region to which the drift layer has failed to reach) in the incident area because the penetration of α-ray radiation in the silicon substrate is on the order of 30 $\mu$m.

Thus, according to the present invention, a PN junction can be formed upon completion of the drift of the impurity without requiring any lapping or grinding step. Because the PN junction is formed within the silicon wafer, as opposed to the surface barrier type diode which is formed between a metallic electrode layer and the silicon wafer, the radiation detector fabricated by the process of the present invention is resistant to environmental factors such as pressure, temperature and foreign particles, and is less likely to suffer from degradation over time. For instance, a damage to the metallic electrode layer is more or less fatal in the case of a radiation detector including a surface barrier type diode, but a PN junction diode would not be substantially affected by such a damage. Also, the process of the present invention allows a large (three inches or larger in diameter) and thicker (5 mm or greater) detector to be fabricated, and this not only increases the efficiency of fabrication but also improves the signal to noise ratio of the detector. More specifically, a thick detector of a given size involves a small electric capacitance because the electric capacitance C is given by the following equation.

$$C=\epsilon_s \cdot \epsilon_0 \cdot (S/d) \tag{Eq. 1}$$

where $\epsilon_s$ and $\epsilon_0$. are dielectric constants of silicon and vacuum, respectively, S is the size (area) of the detector, and d is the thickness of the detector. As is well known in the art, a smaller capacitance means a high signal to noise ratio.

Although the present invention has been described in terms of preferred embodiments thereof, it is obvious to a person skilled in the art that various alterations and modifications are possible without departing from the scope of the present invention which is set forth in the appended claims.

What is claimed is:

1. A process for fabricating a drift-type radiation detector including a PN junction, comprising the steps of:

washing a semiconductor wafer of a first conductivity type;

forming a first diffusion layer in a target area of a first major surface by diffusing a first impurity having the first conductivity type;

forming a second diffusion layer in a target area of a second major surface by diffusing a second impurity having a second conductivity type different from the first conductivity type; and drifting the second diffusion layer toward the first major surface so as to form a drift region extending from the second diffusion layer to the first diffusion layer, and to form a PN junction between the drift region and the first diffusion layer.

2. A process for fabricating a drift-type radiation detector according to claim 1, further comprising, prior to the steps of forming the diffusion layers, oxidizing a first major surface of the semiconductor wafer and a second major surface opposite to the first major surface; and removing a portion of the oxide layers so formed from the target areas of the first and second major surfaces by a photo engraving process.

3. A process for fabricating a drift-type radiation detector according to claim 2, wherein oxidizing the first and second major surfaces of the semiconductor wafer comprises heating the semiconductor wafer in the presence of oxygen.

4. A process for fabricating a drift-type radiation detector according to claim 1, wherein the semiconductor wafer of the first conductivity type consists of a silicon wafer lightly doped with boron.

5. A process for fabricating a drift-type radiation detector according to claim 1, wherein the first impurity consists of a member selected from a group consisting of boron (B), aluminum (Al), indium (In), zinc (Zn), gallium (Ga) and thallium (TI), and the second impurity consists of a member selected from a group consisting of lithium (Li), phosphorus (P), arsenic (As), antimony (Sb) and bismuth (Bi).

6. A process for fabricating a drift-type radiation detector according to claim 5, wherein the first impurity consists of boron (B), and the second impurity consists of lithium (Li).

7. A process for fabricating a drift-type radiation detector according to claim 1, wherein the step of drifting the second diffusion layer toward the first major surface is conducted for a time period t which is determined by the following equation:

$$W = (2 \times \mu V t)^{1/2} \quad \text{(Eq. 1)}$$

where W is the width (cm) of the drift region, $\mu$ is the mobility of the second impurity (cm$^2$/V.sec), V is the reverse bias voltage (V), and t is the drift time (sec).

* * * * *